(12) United States Patent
Willner et al.

(10) Patent No.: US 10,003,356 B2
(45) Date of Patent: Jun. 19, 2018

(54) DEVICES AND METHODS OF SOURCE-ENCODING AND DECODING OF DATA

(71) Applicant: GURULOGIC MICROSYSTEMS OY, Turku (FI)

(72) Inventors: Kai Willner, Lempaala (FI); Ossi Kalevo, Akaa (FI)

(73) Assignee: Gurulogic Microsystems Oy (FI)

( * ) Notice: Subject to any disclaimer, the term of this patent is extended or adjusted under 35 U.S.C. 154(b) by 0 days. days.

(21) Appl. No.: 15/120,058

(22) PCT Filed: Feb. 20, 2015

(86) PCT No.: PCT/EP2015/025007
§ 371 (c)(1),
(2) Date: Aug. 18, 2016

(87) PCT Pub. No.: WO2015/124323
PCT Pub. Date: Aug. 27, 2015

(65) Prior Publication Data
US 2017/0250707 A1    Aug. 31, 2017

(30) Foreign Application Priority Data
Feb. 20, 2014    (GB) .................................. 1403038.1

(51) Int. Cl.
H03M 7/40    (2006.01)
(52) U.S. Cl.
CPC ....... H03M 7/4006 (2013.01); H03M 7/4031 (2013.01)
(58) Field of Classification Search
None
See application file for complete search history.

(56) References Cited

U.S. PATENT DOCUMENTS 3,394,352 A * 7/1968 Wernikoff ............... G06F 13/38
  341/51
5,680,129 A * 10/1997 Weinberger .......... H04N 19/593
  341/65

(Continued)

FOREIGN PATENT DOCUMENTS

CN    102986221 A    3/2013
EP    0 166 607 A2   1/1986
(Continued)

OTHER PUBLICATIONS

Japanese Office Action (with English Translation of relevant portions) dated Mar. 9, 2017 in Japanese Application No. 2016-549710, 12 pages.

(Continued)

*Primary Examiner* — Howard Williams
(74) *Attorney, Agent, or Firm* — Eric L. Sophir; Dentons US LLP

(57) ABSTRACT

An encoder for encoding data to generate corresponding encoded data including information indicative of a frequency, probability or range of one or more symbols to be represented in the encoded data. The encoder can include in the encoded data additional information indicative of whether information indicative of a frequency, probability or range for at least one symbol amongst the one or more symbols is in the encoded data. The encoder can include in the encoded data the additional information of whether information indicative of a frequency, probability or range for at least one symbol amongst the one or more symbols in the encoded data expressed as single availability bit information. The encoder can represent inclusion of information indicative of the frequency, probability or range information by use of a single availability bit value "7", and non-inclusion of information indicative of the frequency, prob- (Continued)

Figure 1:
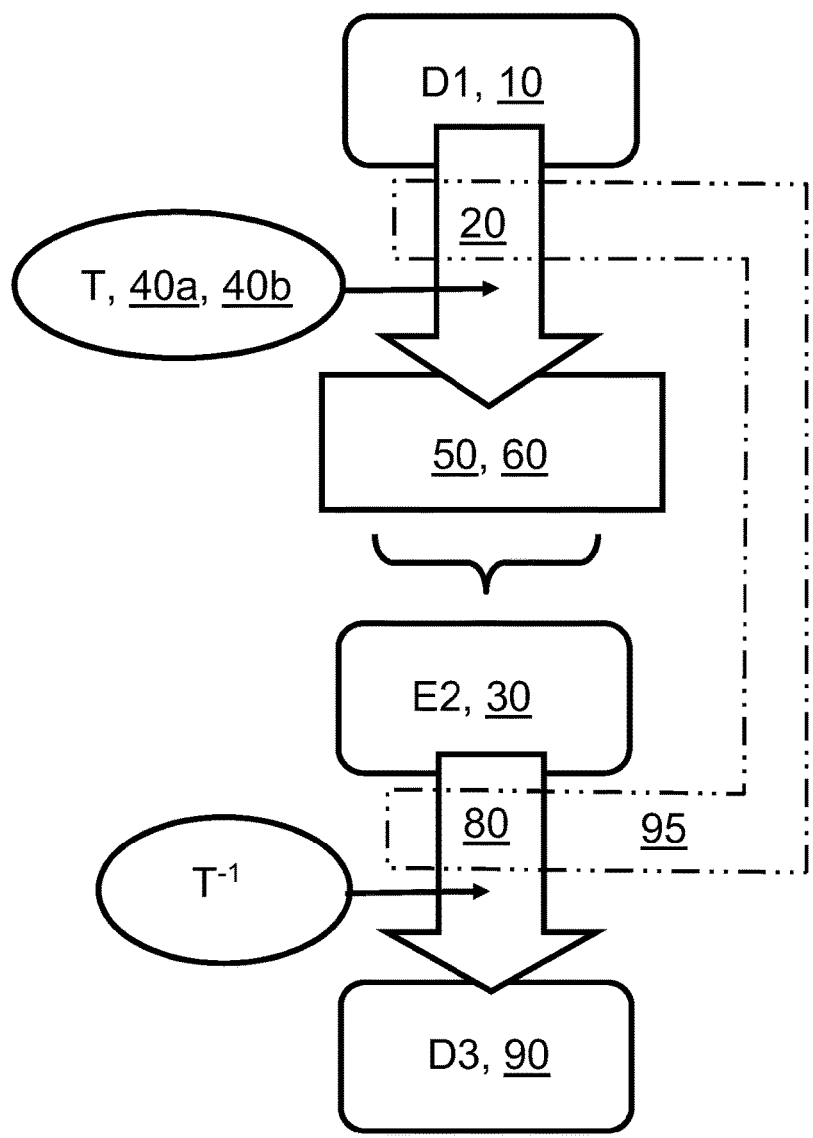

ability or range information by use of a single availability bit value "0".

25 Claims, 3 Drawing Sheets

(56) References Cited

U.S. PATENT DOCUMENTS

| | | | |
|---|---|---|---|
| 6,590,936 B1* | 7/2003 | Kadono | H04N 19/61 375/240.03 |
| 6,650,996 B1 | 11/2003 | Beesley et al. | |
| 2005/0012648 A1 | 1/2005 | Marpe et al. | |
| 2006/0092271 A1 | 5/2006 | Banno et al. | |
| 2011/0310982 A1 | 12/2011 | Yang et al. | |
| 2013/0147843 A1 | 6/2013 | Shimizu | |

FOREIGN PATENT DOCUMENTS

| | | |
|---|---|---|
| EP | 2 387 243 A2 | 11/2011 |
| EP | 2387243 A2 | 11/2011 |
| GB | 1303658.7 | 3/2013 |
| GB | 1303660.3 | 3/2013 |
| GB | 1303661.1 | 3/2013 |
| GB | 2503295 A | 12/2013 |
| JP | 2005-51406 A | 2/2005 |
| RU | 2426227 C2 | 12/2010 |
| WO | WO 2011128268 A1 | 10/2011 |

OTHER PUBLICATIONS

P. Monet et al., "Block Adaptive Quantization of Images," IEEE Transactions on Communications, IEEE Service Center, Piscataway, NJ, USA, vol. 41, No. 2, Feb. 1, 1993, pp. 303-306.
International Search Report issued in International Patent Application No. PCT/EP2015/025007 dated Jun. 3, 2015.
Written Opinion of the International Search Authority issued in International Patent Application No. PCT/EP2015/025007 dated Jun. 3, 2015.
URL: http://en.wikipedia.org/wiki/Range_encoding, Range encoding—Wikepedia, accessed Dec. 13, 2013, pp. 1-4.
URL: http://en.wikipedia.or/wiki/Arithmetic_coding, Range encoding—Wikepedia, accessed Dec. 13, 2013, pp. 5-6.
Russian Office Action and Patent Search Report (with English Translation) dated Apr. 27, 2017 in Russian Application No. 2016133691/08(052271), 15 pages.
Chinese Office Action (with English Summary) dated May 8, 2017 in Chinese Application No. 201580009597.9, 15 pages.
Japanese Office Action (with English Translation) dated Aug. 15, 2017 issued in corresponding Japanese Application No. 2016-549710, 6 pages.
Decision of Grant (with English Translation) dated Aug. 3, 2017 issued in corresponding Russian Application No. 2016133691/08, 12 pages.
Chinese Office Action dated Sep. 28, 2017 (with English Summary and pending claims in English) in corresponding Chinese Application No. 201580009597.9, 15 pages.

* cited by examiner

DEVICES AND METHODS OF SOURCE-ENCODING AND DECODING OF DATA

CROSS REFERENCE TO RELATED APPLICATIONS

This application is a National Stage of PCT/EP2015/025007, filed Feb. 20, 2015, which claims priority under 35 U.S.C. § 119 to GB Application No. 1403038.1, filed Feb. 20, 2014, all of which are incorporated herein by reference in their entirety.

TECHNICAL FIELD

The present disclosure relates to methods of encoding data (D1) to generate corresponding encoded data (E2). Moreover, the present disclosure also relates to methods of decoding aforesaid encoded data (E2) to generate corresponding decoded data (D3) and/or a transcoded version of the decoded data (D3). Furthermore, the present disclosure also relates to encoders and decoders which are operable to implement aforesaid methods; such encoders and decoders in combination constitute codecs. Additionally, the present disclosure relates to computer program products comprising a non-transitory computer-readable storage medium having computer-readable instructions stored thereon, the computer-readable instructions being executable by computing hardware for executing aforementioned methods.

BACKGROUND

In overview, as illustrated in FIG. 1, known encoding methods of encoding input data (D1) 10 in an encoder 20 to generate corresponding encoded output data (E2) 30 involve applying one or more transformations 40a, 40b to the input data (D1) 10 to generate corresponding encoded transformed data 50, wherein the encoded transformed data 50 has associated therewith coding table data 60 defining one or more coding tables defining the one or more transformations employed. The encoded transformed data 50 and the coding table data 60, namely in combination the encoded output data (E2) 30, are often communicated via a data carrier and/or a data communication network to one or more decoders 80 which are operable to decode the encoded output data (E2) 30 to generate corresponding decoded data (D3) 90. Optionally, the decoded data (D3) is a regenerated version of the data (D1), but not limited thereto, for example when transcoding occurs in the one or more decoders 80. It is often desirable that the encoded output data (E2) 30 is compressed relative to the input data (D1) 10. Moreover, it is also desirable that the encoded output data (E2) 30 is compressed in a substantially lossless manner, so that the decoded data (D3) 90 is as accurate as feasible when compared with the input data (D1) 10. Data compression achievable in the encoded output data (E2) 30 relative to the input data (D1) 10 is potentially inefficient when the coding table data 60 is significant in size relative to the encoded transformed data 50, namely the coding table data 60 corresponds to a significant data overhead. In certain known implementations of the encoder 20, the coding table data 60 includes information indicative of frequencies, probabilities or ranges of the coded "symbols" present in the encoded transformed data 50 that were as original symbols in the input data (D1) 10. The coding table data 60 is not limited thereto. Optionally, the coding table data 60 also contains information related to the used transformations and their parameters.

Some known implementations use context information to modify the probabilities included in the coding table data 60. Use of context information is a very efficient way of modifying the probabilities, but it is only efficient for a certain type of data, for example when coding values of pixels in an image, or values after an image transformation has been implemented.

A basic implementation of a range codec is described, for example, at the Wikipedia Range coding site [Range encoding—Wikipedia, the free encyclopedia (accessed Dec. 13, 2013), URL: http://en.wikipedia.org/wiki/Range_encoding]. This basic implementation uses at least one <EOM> (end-of-message) symbol. Arithmetic coding, URL: http://en.wikipedia.org/wiki/Arithmetic_coding is very similar to the Range coding, but it uses one floating point number [0, 1] and an <EOD> (end-of-data) symbol. Moreover, range coding is used widely in applications that require data compression such as video coding and image coding. It is very good at coding large data sets when the probabilities of different possible symbols are known. However, if the nature of the data to be coded is such that the probabilities of the symbols are not known beforehand at the one or more decoders 80, it is necessary to send the probabilities of the symbols together with the encoded data (E2) 30. Otherwise, the compression efficiency of the range coding suffers greatly.

The delivery of the frequency, probability or range values requires inclusion of additional data, namely "consumes data", thus affecting the overall compression efficiency achievable in the encoder 20. Moreover, when more accurate symbol frequencies, probabilities or range values are sent, an improved range coding compression efficiency is achievable. However, sending very accurate frequencies, probabilities or range values requires more data size. In other words, there is a trade-off between sending accurate frequencies, probabilities or range values for the symbols and achieving a best possible compression efficiency in the encoded data (E2).

In contemporary situations, the amount of data transferred and stored in the world is increasing rapidly. As transmission bandwidth and data storage are limiting parameters, a need for efficient data compression methods is of great advantage. Thus, there arises a need for improved methods of compressing data which provide enhanced compression efficiencies obtainable from using range coding, for example in cases where a size of the data to be compressed is not very large. Hence, there arises a need for a method that allows range coding to be used in cases where the use of range coding and similar was not previously feasible and/or beneficial.

In an earlier published European patent document EP 0166607 A2 (King, Reginald Alfred), there is described a method wherein the compression of transmission of samples of (audio) data, in particular time encoded symbols (TES), is potentially improved by presenting bits in a non-linear fashion (variable length codes) instead of a linear representation (fixed-length codes). The method uses precursor codes, which are used for delivering a probability order of occurrences of elements from an encoder to a decoder. That is, the method does not actually transmit probabilities but only their order, for as long as elements arrive.

In an earlier patent document U.S. Pat. No. 6,650,996 B1 (Garmin Ltd.), there are described systems, devices and methods which employ a data structure, wherein there are utilized a first data field defining a decoding structure for decoding canonical Huffman encoded data, and a second data field defining a symbol table. Moreover, the symbol table is adapted to provide a symbol associated with a low-frequency index.

SUMMARY

The present disclosure seeks to provide an improved method of encoding data (D1) to generate corresponding encoded data (E2), wherein the method results in improved data compression in the encoded data (E2), for example in a context of range coding.

The present disclosure also seeks to provide an improved encoder employing the aforesaid improved method.

According to a first aspect, there is provided an encoder for encoding data (D1) to generate corresponding encoded data (E2), wherein the encoded data (E2) includes information of frequencies, probabilities or range values of symbols to be represented in the encoded data (E2), characterized in that the encoder is operable to include in the encoded data (E2) additional information indicative of whether or not information of frequencies, probabilities or range values for the symbols is included in the encoded data (E2).

The present invention is of advantage in that selective inclusion of the information of frequencies, probabilities or range values for the symbols within the encoded data (E2) as a function of occurrence of the symbols in the data (D1) to be encoded, is capable of improving coding efficiency, for example a compression ratio which is achievable, for example in a manner which is highly beneficial when encoding smaller amounts of data (D1).

In the foregoing, the term "whether or not information of . . . " is described in greater detail later.

The encoder, according to the first aspect, is of advantage in that the encoder employs an improved method which is capable of enabling a more efficient delivery of range coding frequencies, probabilities or range values to be achieved in association with the encoded data (E2) generated using the improved method.

Moreover, the aforementioned improved method enables range coding to be utilized in cases where the amount of symbols to be coded is not very large compared to the amount of possible symbols. With known range coding techniques, it is not feasible and/or practical to encode such data due to the amount of bits required to deliver the frequencies, probabilities, or range values; namely, there arises an impractical data overhead associated with delivering frequencies, probabilities or range values from an encoder to a corresponding decoder using known range coding techniques.

Furthermore, the improved method pursuant to the first aspect can be used with or without one or more <EOM> symbols; "EOM" is used to indicate "end-of-message". All the example embodiments described later are shown without one or more <EOM> symbols, but the one or more <EOM> symbols can be optionally added to all example embodiments by utilizing, for example, a probability value 1 for it, and then subtracting 1 from any other probability value. Such a solution does not require delivery of a new probability value, because the probability value is already known. The probability of an <EOM> symbol can also optionally be calculated based on the amount of data symbols. When the probability is calculated, the <EOM> symbol is added to the probability table and it will be given a frequency value 1. The sum of frequencies is also increased by 1 and this influences all symbol probabilities. This also requires that an additional probability value is delivered for the <EOM> symbol.

The improved method according to the first aspect can be used for encoding any type of data, therefore having a wide field of potential use; such "any type of data" to be encoded optionally includes one or more of: genetic sequencing data, DNA sequencing data, RNA sequencing data, captured audio signals, captured video signals, captured images, text data, seismographic data, sensor signals, analog-to-digital (ADC) converted data, biomedical signal data, calendar data, economic data, mathematical data, but not limited thereto. In the improved method, another way to modify the probabilities is to use adaptive probabilities and ranges while coding the data (D1) to generate the corresponding encoded data (E2). Adaptive probabilities work well for encoding larger data streams, especially if the probabilities of the symbols change in a varying manner, but slowly, at different parts in the data stream. However, adaptive probabilities are less suitable for smaller data streams, because additional computing resources and time are required to adapt the probabilities to match the correct probabilities of the symbols in the data stream.

The improved method pursuant to the first aspect is usable in an encoder and a corresponding inverse of the improved method is usable in a corresponding decoder; the encoder and decoder in combination constitute a codec as aforementioned. Optionally, transcoding is performed in the decoder to reformat decoded data thereat, for example to provide compatible data to a data rendering apparatus of the decoder or a data storage apparatus of the decoder. The improved method uses 0-bit and 1-bit information to describe whether or not a range value, a probability value or a frequency value needs to be delivered for the different symbols that might be present among the data stream symbol. This improved method optionally also utilizes one or more probability threshold values to determine which symbols need their own delivered probability value, namely 1-bit, and which symbols can be escaped, for example by using a 0-bit. Optionally, all escaped data symbols can use a probability value 1 in the encoder and in the decoder. Alternatively, all those data symbols that do not have their own frequency or probability value, namely range, are optionally delivered with an escape symbol, namely range, in a range coding scheme. Additionally, all the symbol values for those escaped symbols are optionally delivered, for example as original values without compression.

A concept (i) to (iii), as follows, will next be elucidated in greater detail:

(i) "a coded symbol is known", or (ii) in the encoder, "whether or not information of frequencies, probabilities or range values for the symbols is included in the encoded data", or (iii) in the decoder, "which symbols encoded in the encoded data are to be subjected to decoding using the information of frequencies, probabilities or range values for the symbols"

In embodiments of the present disclosure, it is not essential that the symbols themselves should always be known, but it is essential to know for which symbols the probabilities pertain. Thus, in embodiments of the disclosure, it is made known for which symbols, for example for a queue of data, the probability pertains, but it is not necessarily known based on a context of what the actual symbol is in practice. There must therefore be probability information delivered, for example to the decoder, and available for at least one symbol. However, it is not essential to know what the actual symbol is in practice. There is optionally also a possibility that the value of the symbol is actually known, and in such a case that information is of course utilized.

A further example will next be described. When a frequency, probability or range table is delivered, then important parameters in the delivery are a maximum index of the table and information on which the symbols are that are coded with the delivered probabilities. The maximum index of the table represents how many different symbols, or how many possible different symbols, are available in the delivered table, namely present in the input data D1. Example is as follows:

4, 3, 0, 1, 0, 4, 3, 4

The real maximum index is 4 (and the minimum index is 0), which means that there might be 5 (max−min+1=4−0+1) different symbols (0, 1, 2, 3, 4) present in the data. On account of there actually being only 4 different symbols (0, 1, 3, 4) present in the data D1, the table can be delivered also by using 3 as the maximum index, namely available different symbols, instead of 4 possible different symbols. When the value '3' has been used for the maximum index value of the table, then some other mechanism is optionally employed to deliver the information about which symbols are used for each table indices.

These methods are elucidated in greater detail elsewhere in the present disclosure. When the symbols are in order, then one possibility is to deliver the real maximum index (4) and availability bits (for example, 11011 in this case). This kind of delivery maps so that the table index 0=symbol 0 that is called "index" and the symbol pair will then be (0, 0). Similarly, the rest of the index and symbol pairs are (1, 1), (2, 3) and (3, 4). It is also possible to use index and symbol pairs directly for defining the used indices for different table indices, and then to deliver the maximum index of the table as 3 or the count of different index and symbol pairs as 4. By employing such a method, code table indices typically are in order, and only symbols need to be delivered. Such a method is very advantageous to employ when the symbols in the delivered table are sorted based upon their frequencies.

For example, in this case index and symbol pairs could be (0, 4), (1, 0), (2, 3), and (3, 1) and only values 4, 0, 3, 1 are delivered in order. In some situations:
(a) those used index and symbol pairs are pre-defined;
(b) sometimes the index of the used symbol and index pair table are delivered, at other times the index and symbol pairs are delivered together with the encoded data;
(c) at yet another times, the decoder can retrieve the used index and symbol pairs from the known location, and
(d) in a yet different situation, the decoder can retrieve the used index and symbol pairs from the location that was delivered together with the encoded data.

The frequencies of the parts of the data to be encoded in an encoder employing the aforementioned improved method pursuant to the first aspect are often mutually different, and often their relative data entropy is also mutually different, and for that reason it is beneficial to split, namely to subdivide, the data (D1) into multiple parts when encoding to generate the encoded data (E2). Beneficially, different code tables are used for the different parts. The improved method enables, for example, one big data chunk to be split more efficiently to smaller pieces, namely smaller data chunks, because the delivery of the code table or frequency table is thereby optimized. This split of the data to be encoded enables considerable benefits in respect of the entropy of the data (D1) to be encoded, when split, and so is capable of providing an enhanced degree of compression of the encoded data (E2) relative to corresponding unencoded data (D1).

Optionally, pursuant to the aforesaid first aspect, the encoder is operable to include in the encoded data (E2) the additional information indicative of whether or not the information of frequencies, probabilities or range values for the symbols is included in the encoded data (E2) expressed as single availability bit information. More optionally, the encoder is operable to represent inclusion of the information of frequencies, probabilities or range values for the symbols in the encoded data (E2) by use of a single availability bit value "1", and non-inclusion of the information of frequencies, probabilities or range values for the symbols in the encoded data (E2) by use of a single availability bit value "0". Such availability bit values can also be used vice versa. Moreover, such availability information can also be delivered as a number of available indexes and then indexes of information that are present. These indexes are optionally delivered as they are, or via use of delta coding. Optionally, different coding methods are used for reducing an amount of data needed for delivering availability information. The selected coding method optionally contains the number of available indexes, or the coding method requires that the number of indexes be delivered, or the method requires that the availability bit values are delivered for all the symbols, when the coding table is delivered.

Optionally, in the encoder, the information of frequencies, probabilities or range values of the symbols to be represented in the encoded data (E2) is dynamically varied by the encoder as a function of a nature, namely one or more characteristics, of the data (D1) to be encoded. Such characteristics optionally relate to one or more of: structure of the data (D1), size of the data (D1), range of values present in the data (D1), size of elements present in the data (D1), metadata associated with the data (D1). Moreover, such characteristics include at least one of: a type of the data (D1), content of the data (D1) and/or statistics of the data (D1). More optionally, the encoder is operable to subdivide that data (D1) to be encoded into a plurality of parts, and to generate individually for each part corresponding additional information indicative of whether or not information of frequencies, probabilities or range values for the symbols is included in the encoded data (E2).

Optionally, the encoder is operable to analyze the data (D1) to determine minimum (min) and maximum (max) values occurring therein, and information describing the minimum and maximum values is included by the encoder into the encoded data (E2), wherein the minimum (min) and maximum (max) values limit a range of possibly available symbol values when employing range coding. More optionally, the encoder is operable to express a first symbol and/or a last symbol present in the data (D1) in the encoded data (E2) without use of an availability signal.

Optionally, the encoder is operable to modify an entropy of the data (D1) to be encoded, prior to applying range encoding thereto to generate the encoded data (E2).

Optionally, the encoder is operable to encode the data corresponding to at least one of: genetic sequencing data, DNA sequencing information, RNA sequencing information, captured audio signals, captured video signals, captured images, text data, seismographic data, sensor signals, analog-to-digital (ADC) converted data, biomedical signal data, calendar data, economic data, mathematical data, but not limited thereto.

According to a second aspect, there is provided a method of encoding data (D1) in an encoder to generate corresponding encoded data (E2), wherein the encoded data (E2) includes information of frequencies, probabilities or range values of symbols to be represented in the encoded data (E2), characterized in that the method includes:

using the encoder to include in the encoded data (E2) additional information indicative of whether or not information of frequencies, probabilities or range values for the symbols is included in the encoded data (E2).

Optionally, the method further includes:

using the encoder to include in the encoded data (E2) the additional information indicative of whether or not the information of frequencies, probabilities or range values for the symbols is included in the encoded data (E2) expressed as single availability bit information.

More optionally, the method further includes:

using the encoder to represent inclusion of the information of frequencies, probabilities or range values for the symbols in the encoded data (E2) by use of a single availability bit value "1", and non-inclusion of the information of frequencies, probabilities or range values for the symbols in the encoded data (E2) by use of a single availability bit value "0". Optionally, the values "0" and "1" can be used vice versa for indicating such inclusion or non-inclusion.

Optionally, the method includes using the encoder to vary dynamically the information of frequencies, probabilities or range values of the symbols to be represented in the encoded data (E2) as a function of a nature, namely one or more characteristics, of the data (D1) to be encoded. Reference is herewith made to the foregoing regarding a definition for "nature" and "characteristics" as technical terms.

Optionally, the method includes using the encoder to subdivide the data (D1) to be encoded into a plurality of parts, and to generate individually for each part corresponding additional information indicative of whether or not information of frequencies, probabilities or range values for the symbols is included in the encoded data (E2).

Optionally, the method includes encoding the data (D1) corresponding to at least one of: genetic sequencing data, captured audio signals, captured video signals, captured images, text data, seismographic data, sensor signals, analog-to-digital (ADC) converted data, biomedical signal data, calendar data, economic data, mathematical data, but not limited thereto. Genetic sequencing data is often considerable, as generated by electrophoresis apparatus from biological samples, and often approaches in an order of 1 TeraBytes of data defining nucleic bases and/or amino acids. Handling such data, as well as communicating such data, represents a considerable contemporary technical challenge.

According to a third aspect, there is provided a decoder for decoding encoded data (E2), generated by an encoder pursuant to the first aspect, for generating decoded data (D3).

Optionally, the decoder includes data processing hardware which is operable:
(e) to receive an availability signal;
(f) to receive transmitted frequencies, probabilities or range values in the encoded data (E2);
(g) to construct a complete frequency table, a probability table or a range table from (a) and (b); and
(h) to use the complete frequency table, probability table or range table to range decode the encoded data (E2) to generate the decoded output data (D3).

Optionally, the decoder is operable to execute transcoding upon the decoded output data (D3) to generate corresponding transcoded data.

According to a fourth aspect, there is provided a method of decoding encoded data (E2) in a decoder, characterized in that the method includes performing an inverse of steps of a method pursuant to the second aspect.

Optionally, the method includes:
(i) receiving an availability signal;
(j) receiving transmitted frequencies, probabilities or range values in the encoded data (E2); and
(k) constructing a complete frequency table, a probability table or a range table from steps (a) and (b); and
(l) using the complete frequency table, probability table or range table to range decode the encoded data (E2) to generate the decoded output data (D3).

Optionally, the method includes executing transcoding upon the decoded output data (D3) to generate corresponding transcoded data.

Optionally, in the method, the availability signal includes at least one availability indicative bit.

Optionally, in the method, the availability signal includes at least one availability indicative coding method.

Optionally, in the method, the availability signal includes at least one availability indicative index and/or the amount of indices.

According to a fifth aspect, there is provided a codec including at least one encoder pursuant to the first aspect, and at least one decoder pursuant to the third aspect.

According to a sixth aspect, there is provided a computer program product comprising a non-transitory computer-readable storage medium having computer-readable instructions stored thereon, the computer-readable instructions being executable by computing hardware of an encoder pursuant to the first aspect for implementing a method pursuant to the second aspect.

According to a seventh aspect, there is provided a computer program product comprising a non-transitory computer-readable storage medium having computer-readable instructions stored thereon, the computer-readable instructions being executable by computing hardware of a decoder pursuant to the third aspect for implementing a method pursuant to the fourth aspect.

It will be appreciated that features of the invention are susceptible to being combined in various combinations without departing from the scope of the invention as defined by the appended claims.

DESCRIPTION OF THE DIAGRAMS

Figure 2:
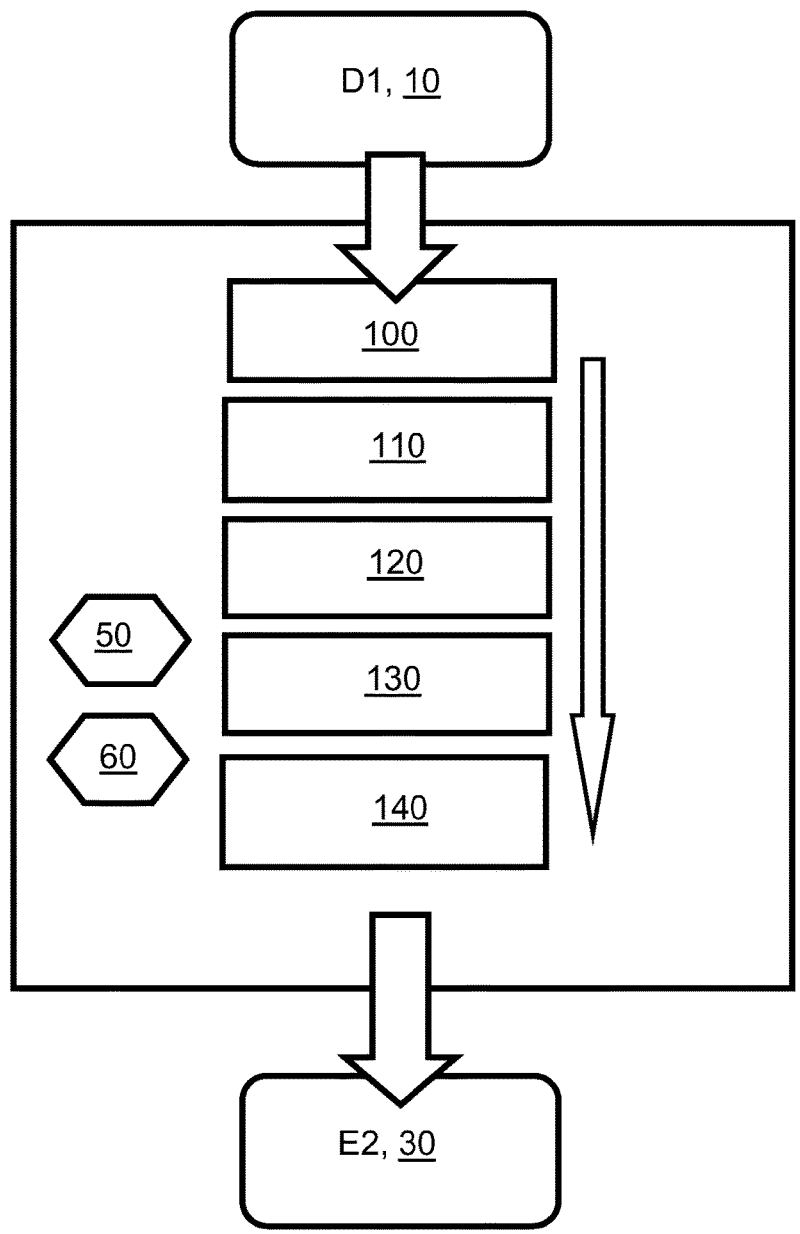
Figure 3:
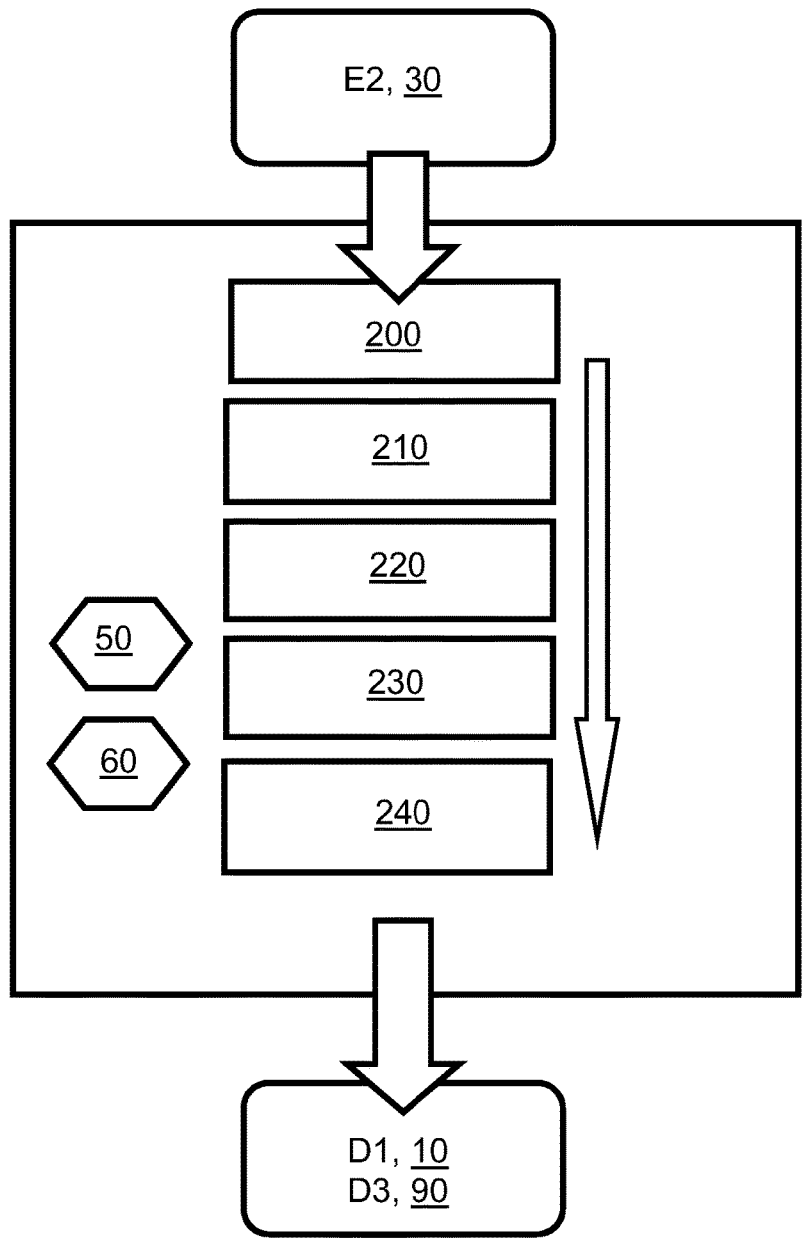

Embodiments of the present disclosure will now be described, by way of example only, with reference to the following diagrams wherein:

FIG. 1 is an illustration of an encoder and a corresponding decoder, wherein the encoder is operable to encode input data (D1) to generate corresponding encoded output data (E2), and the decoder is operable to decode the encoded data (E2) to generate corresponding decoded data (D3);

FIG. 2 is a flowchart of a method of encoding data pursuant to the present disclosure; and FIG. 3 is a flowchart of a method of decoding data pursuant to the present disclosure In the accompanying diagrams, an underlined number is employed to represent an item over which the underlined number is positioned or an item to which the underlined number is adjacent. When a number is non-underlined and accompanied by an associated arrow, the non-underlined number is used to identify a general item at which the arrow is pointing.

Description of Embodiments of the Disclosure

In overview, when employing range coding for encoding data (D1), the probabilities of symbols in the data (D1) that are to be coded have to be known, otherwise an achievable compression efficiency of such range coding correspondingly greatly suffers. The probability of each symbol defines a "range" during coding, wherein the larger the probability, the larger the range. When symbols are coded, the corresponding ranges are updated according to the probability of the coded symbol. If the range becomes small enough, a range coder emits, for example, a byte and increases the range. Thus, for more common symbols, their ranges decrease slowly and more symbols can be coded before a byte is emitted.

When implementing range coding in an encoder, a frequency table index, a probability table index or a range table index, or frequencies, probabilities or range values for symbols are sent in encoded data (E2) generated by the encoder using some given precision, unless already known, namely a priori, at a corresponding decoder; optionally, the encoder is operable to switch dynamically between using a frequency table index, a probability table index, a range table index, frequency values, probability values and range values for mutually different portions of the data (D1) to be encoded. For example, when eight-bit data is being coded within a range codec, there arise potentially $2^8$ symbols, namely 256 symbols. If eight bits, namely one byte, were used to send each frequency, probability or range value, 256 bytes would be required to send all the frequencies, probabilities or range values. In some cases, 256 bytes is potentially larger than the amount of compressed data acquired from the range encoder, therefore there is a clear need to use fewer bits to deliver the frequencies, probabilities or range values; in other words, delivering the frequencies, probabilities or range values from the encoder to the decoder represents a data overhead which is potentially larger than the actual amount of data to be encoded, corresponding to a lower compression ratio performance.

Methods of encoding data (D1) pursuant to the present disclosure are distinguished from known methods in that, in addition to the symbol frequencies, probabilities or range values, there is also sent an availability signal, for example one availability bit for each symbol. The value of this availability bit is beneficially "one", namely "1", for all the symbols which are represented in the encoded data (E2) and have high enough probability, and "zero", namely "0", for all the symbols which are not represented in the encoded data (E2), and 'zero' also for all the symbols that are represented in the encoded data (E2) but have a relatively low probability.

In methods of encoding data (D1) pursuant to the present disclosure, whether or not a symbol has low enough probability is checked, for example, by comparing the probability of a symbol to a threshold, optionally more than one threshold value. When encoding the symbols, the probability for the symbols which are not present in the encoded data (E2) or which have a probability lower than a threshold is 'zero' (an escape code is used and no range is preserved for the symbol) or 'one' (namely, low probability symbols delivered with smallest possible range), namely '0' or "1", is regardless of the size of the whole range used for encoding the input data (D1) 10 provided to the encoder 20 for generating the encoded data (E2) 30; such pertains when the encoder 20 and the one or more decoders 80 employ the improved method (T) and an inverse ($T^{-1}$) thereof, respectively. The amount A (in bits) of encoded data required to send the frequencies, probabilities or ranges and the availability signal (for example, availability bits in this example) is then the number $N_S$ of those symbols present, or available, in the encoded data (E2) which have high enough probability times the number $N_B$ of bits used for each frequency, probability or range value plus one availability bit for all symbols $O_S$; in other words:

$$A = N_S * N_B + O_S \qquad \text{Eq. 1}$$

The next example of the improved method pursuant to the present disclosure is applied in an encoder 20 to encode a set of data values as input data (D1) 10 to generate corresponding encoded data (E2) 30. In this example, a coded data stream (D1) contains 150 data values that can contain 20 symbols (=values), namely from 0 to 19, but only 8 of those 20 possible data values, namely min=2 and max=19, are actually represented in the current data stream. These min and max values (min="minimum", max="maximum") are optionally also delivered as described, for example, in an ODelta coding a method disclosed in a patent application GB1303661.1 filed on 1 Mar. 2013 by Gurulogic Microsystems Oy; "ODelta" encoding relates to a delta encoding method with offset and wraparound computations for providing especially efficient encoding of data. This enables a reduction in some bits needed for delivering an availability signal. Moreover, this also reduces the data range of possibly available symbol values when some method to modify entropy, such as for example ODelta coding, is used before range encoding is employed. A best advantage associated with use of the min and max values is achieved when all the methods modifying entropy and range coding use the same information and that information is delivered only once from an encoder to a corresponding decoder. Table 1 below shows the frequencies and probabilities of the symbols, for example. The probability is computed by dividing the frequency by the total number of data values.

TABLE 1

Example range encoding pursuant to the present disclosure

| Value (Symbol in data) | Frequency | Probability | Probability with 7 bits | Probability with 7 bits (escaped) | Probability with 7 bits (modified) | Probability with 6 bits (modified) |
|---|---|---|---|---|---|---|
| 2 | 7 | 0.047 | 6 | 6 | 6 | 2 |
| 4 | 2 | 0.013 | 2 | (0) | (1) | (1) |
| 7 | 81 | 0.54 | 69 | 69 | 63 | 28 |
| 9 | 1 | 0.007 | 1 | (0) | (1) | (1) |
| 12 | 39 | 0.26 | 33 | 33 | 30 | 13 |
| 13 | 9 | 0.06 | 8 | 8 | 7 | 3 |

TABLE 1-continued

Example range encoding pursuant to the present disclosure

| Value (Symbol in data) | Frequency | Probability | Probability with 7 bits | Probability with 7 bits (escaped) | Probability with 7 bits (modified) | Probability with 6 bits (modified) |
|---|---|---|---|---|---|---|
| 14 | 3 | 0.02 | 2 | 2 | 2 | (1) |
| 19 | 8 | 0.053 | 7 | 7 | 6 | 3 |
| Escape | 0 | 0.0 | (0) | 3 | x12 | x12 |
| Sum | 150 | 1.000 | 128 | 128 | 114 + 14 = 128 | 49 + 15 = 64 |

In Table 1, there are a couple of symbols that have a very low probability of occurrence. In an event that 7 bits are used to deliver the probabilities, if the same amount of bits to describe each probability were used, there would be needed 20*7=140 bits to express all the probabilities. If the presence of symbols in the stream, namely in the encoded data (E2) 30, is expressed by sending, for example, one availability bit per each symbol, we would still need 8*7+20*1=76 bits to express all the probabilities.

Already this initial embodiment, for implementing the improved method pursuant to the present disclosure, differs from known solutions on account of using separate availability bits to reduce the amount of delivered probabilities from 20 to 8. With regard to other embodiments of the present disclosure described later, it is optionally beneficial to ensure that the threshold that determines whether a given probability is sent to the decoder 80 or not, for example the threshold is optionally set to 0.018 with 7 bits probability. Modifying the threshold changes the amount of bits in the encoded data (E2) 30 needed to express and deliver the probabilities to the one or more decoders 80. If 0.10 is selected as the threshold for the data described by Table 1, only two symbols will be left and then 2*x+20*1 bits are needed for expressing the probabilities in the encoded data (E2) 30, where x refers to the bit count used to express the probability.

Finding an optimal threshold for use when implementing the improved method of the disclosure depends upon an amount of encoded data (E2) 30 to be sent from the encoder 20 to the one or more decoders 80, and upon frequencies of symbols represented in the encoded data (E2) 30. A manner in which the one or more aforesaid thresholds are determined will now be elucidated in greater detail. For example, let T=the threshold, and
B=the bit count used to express the probability, for example in the Table 1 above, expressible in either 6 or 7 bits. The threshold is beneficially inside given recommended limits, and not smaller than a lower threshold limit $T_{LOW}$, as determined by Equation 2 (Eq. 2):

$$T_{LOW} = \frac{1}{2^B}$$ Eq. 2

$$\frac{2}{2^B} \leq T_{Recommended} \leq \frac{8}{2^B}$$

In the last four columns in Table 1, there are shown the actual probabilities that are sent to the one or more decoders 80. In the "Probability with 7 bits" column, there is shown the probability sent if 7 bits are used for all the 8 or 20 data values, with or without an availability signal, wherein the availability signal refers to signal expressing the presence of symbols in the stream. The "Probability with 7 bits (escaped)" corresponds to a probability sent utilizing a first embodiment of the improved method pursuant to the present disclosure, and the "Probability with 7 (or 6) bits (modified)" corresponds to a probability sent utilizing a second embodiment of the improved method pursuant to the present disclosure.

The probabilities shown in parenthesis in the last three columns of Table 1, are not actually sent to the one or more decoders 80, as they are expressed by using the zero availability bit. In this example, the probabilities sent to the one or more decoders 80 are close to the probabilities sent with known methods of encoding, thus utilizing the improved method pursuant to the present disclosure does not affect the efficiency of actual range coding significantly, but can improve overall compression efficiency greatly by reducing the number of bits required to be sent for frequencies, probabilities or range values. Moreover, it will be appreciated that the sum of the probabilities sent in a known manner, or an escaped case, is 128, whereas in the improved method according to the second embodiment involves the sum of the probabilities being sent as shown in the table, namely either 114 or 49. This arises on account of reserving the probability value 'one' for each data value that was expressed with a zero availability bit, wherein there are 14 or 15 of these data values, wherein 12 data values are not present in the stream, and 2 or 3 values that have lower probability than the threshold.

In this example, using 7 bits and a threshold as well, symbols 4 and 9 are expressed with a zero availability bit, together with all the 12 symbols that are not present in the data stream. Originally, there was no range, called escape, reserved for those symbols that are not present in the data stream. Now, there will have to be a mechanism to deliver also those symbols 4 and 9 that do not get their own probability. This can be efficiently done by using two different embodiments described below.

The first embodiment, shown in the Table 1 above with "(escaped)", is where a separate escape symbol and its associated range are created. When the symbol does not have its own range, it is delivered with the escape (range). Additionally, the symbol value is also delivered in its own data stream. The symbol value can be delivered with 5 bits in this example, because the symbol value range is 0 to 19. Optionally, when the ratio of available symbols divided by all possible symbols is high, namely greater than 0.25, the symbol value is beneficially delivered with a slightly smaller amount of bits, by delivering the symbol value with its corresponding availability 0-bit position. For example, in this example case, a symbol value 4 corresponds to an availability 0-bit 3 and a symbol value 9 corresponds to an availability 0-bit 7, in the bit stream, namely "00100001000011100001". Therefore, there are only 14 availability 0-bits available in the stream and only 4 bits are needed to present them, namely to represent them in the encoded data (E2). The delivery of separate symbol value stream is optionally avoided, namely the probabilities of the range coding are switched from normal probabilities to being equal probabilities of all symbols, or as equal probabilities of all availability 0-bit symbols, as possible after escape (range) symbol delivery for delivering the actual data value, and then probabilities are returned back to the normal probabilities, when the actual symbol value is delivered.

The second embodiment defines that all the availability 0-bit symbols will be allocated a probability '1', and a remainder of the range is preserved for the availability 1-bit symbols from the full range of probabilities. Such solutions, shown in the Table 1 with "(modified)", are also described. Now, there are 12+2 escaped symbols, in the 7 bits example above, and they are allocated 14 values from 128 available values. The remaining 114 values are used for those 6 symbols that are allocated with availability 1-bit. A similar example is also presented using 6 bits for range probabilities in the last column of the Table 1, wherein the threshold value is in this example selected to be 0.4. As aforementioned, this time those availability 0-bit symbols in the bit stream can be understood as being escape symbols, and they all will be allocated their own probability value '1', as shown in the Table 1 with parenthesis.

The amount of bits needed for delivering probability values will now be described. The combined (escape) solution uses 7*7+20*1=69 bits. In this example, it is not a preferred solution because it saves only seven (76–69) bits in probability table delivery as compared to the first embodiment pursuant to the present disclosure, but uses 3*4=12 bits for additional escaped symbol values delivery. Thus, the better probability of one or more escaped symbols compared to the original symbols is not enough to compensate for the increase in data size. This time, the probability of other symbols is the same and benefits are not achieved by delivering those symbols either.

This improved method is also useful in another way, for example when a lot of symbols are escaped, but their probability is not very high. Sometimes, it is also feasible to use a lower amount of bits as well for escape symbols than for original symbols, because the smallest probabilities are delivered in any case with a combined escape code. The second embodiment with modified probabilities uses 6*7+20*1=62 bits (with 7-bit) or 5*6+20*1=50 bits (with 6 bits). The delivery of probabilities is optionally even better optimized by knowing or delivering information denoting the probability of the most frequent symbol represented in the encoded data (E2) 30.

Now, when the highest probability value is below 64, and below 32, probabilities are optionally delivered with 6 bits (and 5 bits) in these examples, so the total probability table delivery requires only 6*6+20*1=56 bits (with 7 bits example), and 5*5+20*1=45 bits (with 6 bits example). Moreover, the delivery of this 20*1 availability bit stream is optionally compressed; in addition to compressing the availability bits, it is also feasible to implement embodiments of the present disclosure by compressing frequency tables or probability values; such compression is optionally implemented via use of one or more compression methods. This is the case especially when there are lot of possible symbols available and there are different availability 0-bit and availability 1-bit probabilities, namely lots of 0's or lots of 1's, or they are located in different parts of the bit stream in the encoded data (E2) 30. Optionally, when the range of available symbols is limited separately, for example by delivering min and/or max values, the first and/or the last symbols are known to be available in the stream and those are not needed to be communicated via use of an availability signal, for example availability bits for it or them are not needed to be delivered. There is only a need to deliver availability signal, for example availability bits, for the range from min+1 to max−1. In this Table 1 example, the saving is 31 (76−45) bits compared to the case where the symbol presence was expressed, namely the first improved method. The saving is 95 (140−45) bits compared to known methods. Such savings are not lost with less accurate probabilities of symbols and so these improved methods are clearly advantageous methods to deliver the data in this example.

Optionally, probability information is delivered in the encoded data (E2) 30 with even less accurate probability values, or by using a higher threshold value and thus achieving even more data size savings in the probability table delivery via the encoded data (E2) 30. The savings in probability table delivery results typically also in some loss in entropy coding. Such loss has to be taken into account when selecting a best possible table delivery method when implementing embodiments of the present disclosure.

The improved methods of the disclosure are also optionally used for original data in some cases, to save on data size, for example when storing in databases, on data carriers and similar. It will be appreciated that, in examples provided in the foregoing, the original data contains only 150 symbols and 8 different values and so the original 150*5=750 bits information can be delivered also with 150*3+20*1=470 bits by using the availability bit information directly for the original data. Range coding with table delivery and entropy coding is capable of achieving a smaller data size than the original data. It will be appreciated that different methods that modify entropy of the data can be used before the range coding. Similarly, their inverse operations then need to be done after the range decoding. Such methods that modify entropy include, for example, Delta coding, ODelta coding, namely a method disclosed in a patent application GB1303661.1 filed on 1 Mar. 2013 by Gurulogic Microsystems Oy (hereby incorporated by reference, wherein ODelta encoding employs a combination of Delta coding, an offset computation and a wraparound computation), entropy modifier (EM), a method disclosed in patent application GB1303658.7, filed on 1 Mar. 2013 by Gurulogic Microsystems Oy (hereby incorporated in reference), run length encoding (RLE), and split run length encoding (SRLE), a method disclosed in patent application GB1303660.3, filed on 1 Mar. 2013 by Gurulogic Microsystems Oy (hereby incorporated by reference).

As described earlier, improved methods pursuant to the present disclosure beneficially optionally do not utilize one or more <EOM> symbols when implementing range coding, because of an amount of data to be encoded (=amount of data to be decoded) or an amount of encoded data (that will need to be decoded) can be delivered instead. Based on that amount of data to be encoded or amount of encoded data that are present in the encoded data (E2) 30 after range encoding can be used when the data (D3) 90 is decoded with range decoding. Moreover, pursuant to the present disclosure, there is no need for delivering an additional <EOM> symbol after data during range coding for generating the encoded data (E2) 30.

Optionally, when the probability values are delivered, for example via the encoded data (E2) 30 but not limited thereto, there is no need to deliver the last probability value when the sum of probability values is known, for example preset, or has already been delivered to the one or more decoders 80. The last probability value for symbol, escape, <EOM> or true symbol present in data, are optionally calculated by subtracting from the probability sum all the previously delivered values. In any case, the sum needs to be known, so that the decoding of probability values can be executed properly in the one or more decoders 80. Some bits can thus optionally be saved form the data size in advance by not delivering the last probability value.

Although examples of the present disclosure are provided in respect of range coding, they are also susceptible to being employed mutatis mutandis for arithmetic coding and binary arithmetic coding implemented in the encoder 20. When such arithmetic coding and binary arithmetic coding are implemented in the encoder 20, the escape code is not used in the actual coding process, but instead for determining a manner in which to transmit the probability range for similar future items. However, such a method is less efficient than aforementioned improved methods of the present disclosure, which use an availability signal and a probability value to convey that a given symbol exists, and an indication of an associated probability of the given symbol; reference is herewith made to known "Compression ratio is generally lower, than in static <http://compressions.sourceforge.net/Arithmetic.html#static> coding. Although for short input sequences benefit of not sending statistics data can be more significant". Thus, improved methods of the present disclosure represent a considerable technical advance in data encoding technology.

The improved methods of encoding pursuant to the present disclosure are susceptible to being used in data handling and data generating devices, for example in personal computers, portable wireless enabled computers, phablet computers, tablet computers, smart telephones, mobile telephones ("cell phones"), audio-visual apparatus, digital cameras, video cameras, scientific instruments, gene sequencing apparatus, televisions, surveillance apparatus, but not limited thereto. The improved methods are optionally implemented in digital hardware, for example Application Specific Integrated Circuits (ASICs). Alternatively, or additionally, the improved methods are susceptible to being implemented using one or more software products recorded on non-transitory (non-transient) machine-readable data storage media, wherein the software products are executable upon computing hardware. Optionally, the one or more software products are downloadable via a communication network as "software apps", for example to wireless-enabled portable communication devices, for example mobile telephones. The encoder 20 and the corresponding decoder 80 are susceptible to being implemented as a codec 95, for example for use in portable signal capture apparatus, for example digital cameras, Internet-enabled multimedia apparatus, games-playing apparatus, surveillance cameras, environmental monitoring apparatus and such like, but not limited thereto.

Referring next to FIG. 2, there are shown steps of a method encoding the data (D1) 10 in the encoder 20 to generate the corresponding encoded data (E2) 30. The steps are optionally performed in sequence as illustrated, although certain of the steps are optional, and their order of execution may be varied.

TABLE 2

Steps of a method of encoding data

| Step | Operation | Detail |
|---|---|---|
| 100 | Receive the data (D1) 10 and analyze its data characteristics to determine information describing probabilities of symbols occurring therein | Non-optional |
| 11 | Determine whether or not the data (D1) 10 is beneficially subdivided into a plurality of parts, wherein each part is encoded separately with associated probability of occurrance of symbols therein | Optional |
| 120 | Generate data indicative of whether of not a given symbol is represented in the encoded data (E2) 30 by way of the information describing probabilities of symbols occurring therein with an availability signal, for example expressed as single availability bit information, for example as "1" or "0" or coding method, or number of indexes and their values. | Non-optional |
| 130 | Applying optionally one or more threshold limits to determine whether or not probability information is sent regarding one or more symbols present in the data (D1) 10 | Optional |
| 140 | Encoding symbols of the data (D1) 10, together with information describing probabilities of symbols occurring therein from the step 100, and also the indicative data of the step 120, to generate the encoded data (E2) 30 | Non-optional |

In the one or more decoders 80, a reverse of Table 2 is substantially performed, namely the frequency, probability or range information is extracted from the encoded data (E2) 30 derived from the step 100, and the data from the step 120 is employed to determine which symbols encoded in the encoded data (E2) 30 are to subject to decoding using the frequency, probability or range information and which other symbols are not to be decoded in such a manner, wherein results of such computations are assembled together to provide the decoded data (D3) 90. Optionally, the one or more decoders 80 are operable to perform transcoding, such that the data D1 and the data D3 are mutually different. Such transcoding is, for example, advantageous when the one or more decoders 80 are mutually different, and the data D3 is to be rendered on mutually different presentation apparatus which require transcoding to be customized for such presentation apparatus, for example pixel display resolution and display aspect ratio.

Referring next to FIG. 3, there are shown steps 200 to 240 of a method of decoding the encoded data (E2) 30 to generate the decoded data (D3) 90; optionally, the decoded data (D3) 90 is a regenerated version of the data (D1) 10, but not limited thereto. In operation, in the step 200, the decoder 80 receives an availability signal, namely the availability bits, or the coding method, or the amount of the indices and the indices themselves. Moreover, in the step 210, the decoder 80 receives the transmitted frequencies, the probabilities or the range tables in the data number 60, (which is included in the data E2, 30), of which the decoder 80 constructs a complete frequency table, a probability table or a range table. The "0" bit slot is beneficially set to the value of "0", or "1", if so desired, and the "1" bit slot will be set to the value of the received frequency, probability or range. If a frequency table is received, it is converted into a probability table, so that it can be used in range coding. It will be appreciated that also the encoder 20 always needs to convert a frequency table into a probability table before encoding can be efficiently executed by utilizing range coding. After the construction of the probability table in the decoder 80, of which the combined sum of values is a power of two, in the steps 220 to 240, it is then possible to range decode the received transformed data 50 (which is included in the data E2, 30), and thus produce the decoded output data (D3) 90. The steps 200 to 240 correspond substantially to an inverse of the steps 100 to 140 in FIG. 2.

The encoder 20 and the decoder 80 are susceptible to being employed in a wide range of data handling apparatus, for example wireless communication devices, audio apparatus, audio-visual apparatus, computing apparatus, video conferencing apparatus, surveillance apparatus, scientific measuring apparatus, genetic sequencing apparatus, genetic sequence analysis apparatus, communication system hardware and/or software, communication network hardware and/or software, but not limited thereto.

Modifications to embodiments of the invention described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Numerals included within parentheses in the accompanying claims are intended to assist understanding of the claims and should not be construed in any way to limit subject matter claimed by these claims.

We claim:

1. An encoder for encoding data employing range coding to generate corresponding encoded data, wherein the encoded data includes information of frequencies, probabilities or range values of different symbols to be represented in the encoded data, characterized in that the encoder is operable to include in the encoded data additional information indicative of whether or not the information of frequencies, probabilities or range values for the different symbols is included in the encoded data, the additional information being indicative of the individual symbols to which the frequencies, probabilities, or range values pertain.

2. The encoder in claim 1, wherein the encoder is operable to include in the encoded data the additional information indicative of whether or not the information of frequencies, probabilities or range values for the symbols is included in the encoded data expressed as single availability bit information.

3. The encoder in claim 2, wherein the encoder is operable to represent inclusion of the information of frequencies, probabilities or range values for the symbols in the encoded data by use of a single availability bit value "1", and non-inclusion of the information of frequencies, probabilities or range values for the symbols in the encoded data by use of a single availability bit value "0".

4. The encoder in claim 1, wherein the information of frequencies, probabilities or range values of the symbols to be represented in the encoded data is dynamically varied by the encoder as a function of one or more characteristics of the data to be encoded.

5. The encoder in claim 4, wherein the one or more characteristics include at least one of: a type of the data, content of the data and/or statistics of the data.

6. The encoder in claim 4, wherein the encoder is operable to subdivide the data to be encoded into a plurality of parts, and to generate individually for each part corresponding additional information indicative of whether or not information of frequencies, probabilities or range values for the symbols is included in the encoded data.

7. The encoder in claim 1, wherein the encoder is operable to analyze the data to determine minimum (min) and maximum (max) values occurring therein, and information describing the minimum and maximum values is included by the encoder into the encoded data, wherein the minimum (min) and maximum (max) values limit a range of possibly available symbol values when employing range coding.

8. The encoder in claim 7, wherein the encoder is operable to express a first symbol and/or a last symbol present in the data in the encoded data without use of an availability signal.

9. The encoder in claim 1, wherein the encoder is operable to modify an entropy of the data to be encoded, prior to applying range encoding thereto to generate the encoded data.

10. The encoder in claim 1, wherein the encoder is operable to encode the data corresponding to at least one of: captured audio signals, genetic sequencing data, captured video signals, captured images, text data, seismographic data, sensor signals, analog-to-digital (ADC) converted data, biomedical signal data, calendar data, economic data, mathematical data.

11. A method of encoding data employing range coding in an encoder to generate corresponding encoded data, wherein the encoded data includes information of frequencies, probabilities or range values of different symbols to be represented in the encoded data, the method comprising:

using the encoder to include in the encoded data additional information indicative of whether or not the information of frequencies, probabilities or range values for the different symbols is included in the encoded data, the additional information being indicative of the individual symbols to which the frequencies, probabilities, or range values pertain.

12. The method in claim 11, wherein the method further includes:

using the encoder to include in the encoded data the additional information indicative of whether or not the information of frequencies, probabilities or range values for the symbols is included in the encoded data expressed as single availability bit information.

13. The method in claim 12, wherein the method further includes:

using the encoder to represent inclusion of the information of frequencies, probabilities or range values for the symbols in the encoded data by use of a single availability bit value "1", and non-inclusion of the information of frequencies, probabilities or range values for the symbols in the encoded data by use of a single availability bit value "0".

14. The method in claim 11, wherein the method includes using the encoder to vary dynamically the information of frequencies, probabilities or range values of the symbols to be represented in the encoded data as a function of one or more characteristics of the data to be encoded.

15. The method in claim 14, wherein the method includes using the encoder to subdivide the data to be encoded into a plurality of parts, and to generate individually for each part corresponding additional information indicative of whether or not information of frequencies, probabilities or range values for the symbols is included in the encoded data.

16. The method in claim 11, wherein the method includes encoding the data corresponding to at least one of: genetic sequencing data, captured audio signals, captured video signals, captured images, text data, seismographic data, sensor signals, analog-to-digital (ADC) converted data, biomedical signal data, calendar data, economic data, mathematical data.

17. A decoder for decoding encoded data generated by an encoder employing range coding, wherein the encoded data includes information of frequencies, probabilities or range values of different symbols to be represented in the encoded data, characterized in that the encoder is operable to include in the encoded data additional information indicative of whether or not the information of frequencies, probabilities or range values for the different symbols is included in the encoded data, the additional information being indicative of the individual symbols to which the frequencies, probabilities, or range values pertain.

18. The decoder in claim 17, wherein the decoder includes data processing hardware which is operable:
(a) to receive an availability signal;
(b) to receive transmitted frequencies, probabilities or range values in the encoded data;
(c) to construct a complete frequency table, a probability table or a range table from (a) and (b); and
(d) to use the complete frequency table, probability table or range table to range decode the encoded data to generate the decoded output data.

19. The decoder in claim 17, wherein the decoder is operable to execute transcoding upon the decoded output data to generate corresponding transcoded data.

20. A method of decoding encoded data in a decoder, characterized in that the method comprises:
decoding encoded data from an encoder that generated the encoded data employing range coding, wherein the encoded data includes information of frequencies, probabilities or range values of different symbols to be represented in the encoded data and the encoded data includes additional information indicative of whether or not the information of frequencies, probabilities or range values for the different symbols is included in the encoded data, the additional information being indicative of the individual symbols to which the frequencies, probabilities, or range values pertain.

21. The method in claim 20, wherein the method includes:
(a) receiving an availability signal;
(b) receiving transmitted frequencies, probabilities or range values in the encoded data;
(c) constructing a complete frequency table, a probability table or a range table from steps (a) and (b); and
(d) using the complete frequency table, probability table or range table to range decode the encoded data to generate the decoded output data.

22. The method in claim 20, wherein the method includes executing transcoding upon the decoded output data to generate corresponding transcoded data.

23. A codec comprising:
an encoder for encoding data employing range coding to generate corresponding encoded data, wherein the encoded data includes information of frequencies, probabilities or range values of different symbols to be represented in the encoded data characterized in that the encoder is operable to include in the encoded data additional information indicative of whether or not the information of frequencies, probabilities or range values for the different symbols is included in the encoded data, the additional information being indicative of the individual symbols to which the frequencies, probabilities, or range values pertain; and
a decoder for decoding encoded data generated by the encoder.

24. A computer program product comprising a non-transitory computer-readable storage medium having computer-readable instructions stored thereon, the computer-readable instructions being executable by computing hardware of an encoder for implementing a method comprising:
encoding data employing range coding, wherein the encoded data includes information of frequencies, probabilities or range values of different symbols to be represented in the encoded data; and
using the encoder to include in the encoded data additional information indicative of whether or not the information of frequencies, probabilities or range values for the different symbols is included in the encoded data, the additional information being indicative of the individual symbols to which the frequencies, probabilities, or range values pertain.

25. A computer program product comprising a non-transitory computer-readable storage medium having computer-readable instructions stored thereon, the computer-readable instructions being executable by computing hardware of a decoder for implementing a method comprising:
decoding encoded data from an encoder that generated the encoded data employing range coding, wherein the encoded data includes information of frequencies, probabilities or range values of different symbols to be represented in the encoded data, and the encoded data includes additional information indicative of whether or not the information of frequencies, probabilities or range values for the different symbols is included in the encoded data, the additional information being indicative of the individual symbols to which the frequencies, probabilities, or range values pertain.

* * * * *